United States Patent
Vissenberg et al.

(10) Patent No.: US 8,511,878 B2
(45) Date of Patent: Aug. 20, 2013

(54) FLAT AND THIN LED-BASED LUMINARY

(75) Inventors: Michel Cornelis Josephus Marie Vissenberg, Eindhoven (NL); Willem Lubertus Ijzerman, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 953 days.

(21) Appl. No.: 12/445,312

(22) PCT Filed: Oct. 12, 2007

(86) PCT No.: PCT/IB2007/054165
§ 371 (c)(1),
(2), (4) Date: Nov. 10, 2009

(87) PCT Pub. No.: WO2008/047284
PCT Pub. Date: Apr. 24, 2008

(65) Prior Publication Data
US 2010/0073925 A1    Mar. 25, 2010

(30) Foreign Application Priority Data

| Oct. 16, 2006 | (EP) | 06122321 |
| Jan. 11, 2007 | (EP) | 07100359 |
| Jan. 11, 2007 | (EP) | 07100360 |
| Jan. 11, 2007 | (EP) | 07100361 |
| Jan. 30, 2007 | (EP) | 07101366 |

(51) Int. Cl.
*F21F 7/04* (2006.01)
(52) U.S. Cl.
USPC ............ 362/560; 362/561; 362/610; 362/615
(58) Field of Classification Search
USPC .................... 362/560, 561, 610, 615
See application file for complete search history.

(56) References Cited

U.S. PATENT DOCUMENTS

| 5,664,862 | A | 9/1997 | Redmond et al. |
| 6,130,730 | A | 10/2000 | Jannson et al. |
| 6,241,358 | B1 | 6/2001 | Higuchi et al. |
| 6,561,663 | B2 * | 5/2003 | Adachi et al. ................ 362/616 |
| 6,874,900 | B2 * | 4/2005 | Hsieh ............................ 362/26 |
| 7,703,936 | B2 * | 4/2010 | Ohkawa ...................... 362/97.1 |
| 2002/0030999 | A1 | 3/2002 | Lundin |
| 2007/0070618 | A1 * | 3/2007 | Talamo et al. ............. 362/153.1 |

FOREIGN PATENT DOCUMENTS
EP     1670069 A1    6/2006

* cited by examiner

*Primary Examiner* — Jong-Suk (James) Lee
*Assistant Examiner* — Mark Tsidulko
(74) *Attorney, Agent, or Firm* — John F. Salazar; Mark L. Beloborodov

(57) ABSTRACT

A light emitting device is provided, comprising a light guide plate (100) and at least one light emitting diode (110). An array of mutually spaced apart reflective surface elements (103, 103') is arranged between said back surface (102) and said front surface (103). The reflective surface elements (103, 103') are non-parallel relative to said back surface (101) and front surface (102), and have a front side (104) facing said front surface (102) and a back side (105) facing said back surface (101). The back surface (105) of a reflective surface element (103) faces the front surface (104) of an adjacent reflective surface element (103'). The at least one light emitting diode (110) is arranged to emit light into a region (111) between two adjacent ones of said reflective surface elements (103, 103'). Since the reflective surface elements are located within the light guide, both the back surface and the front surface of the light guide plate may be made flat. This flat surface may easily be kept clean from dust and dirt.

14 Claims, 3 Drawing Sheets

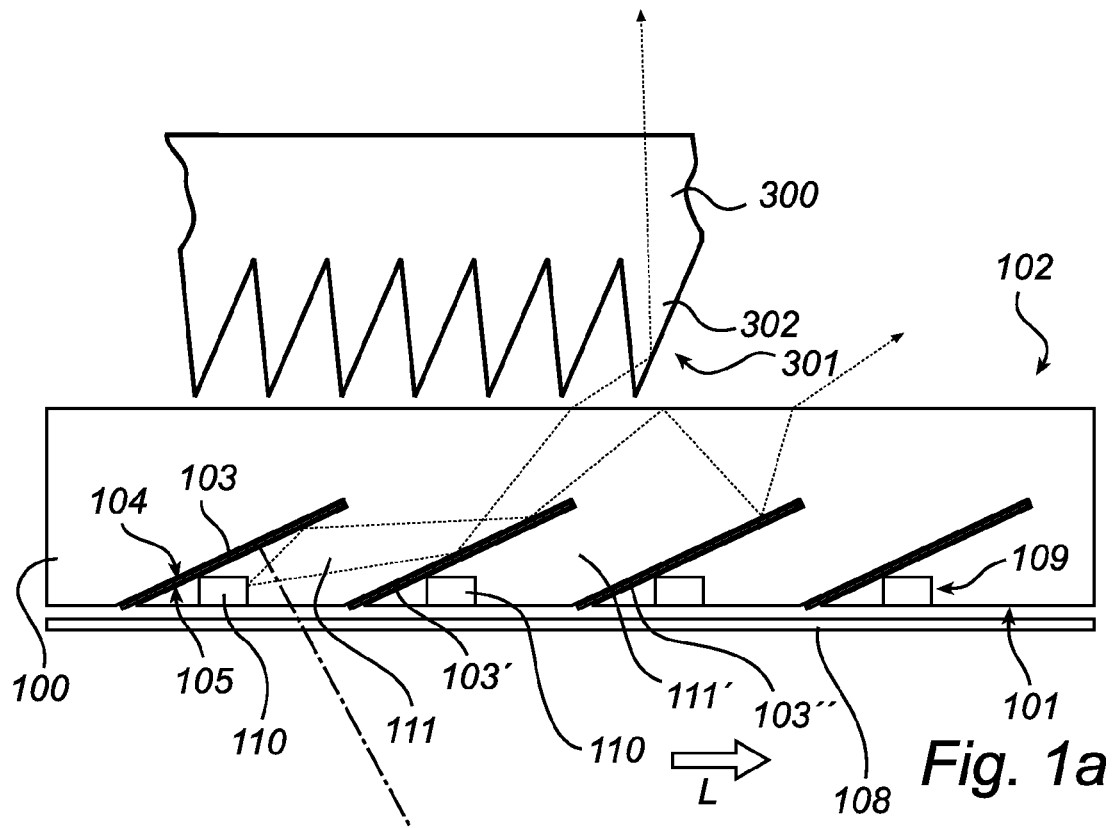
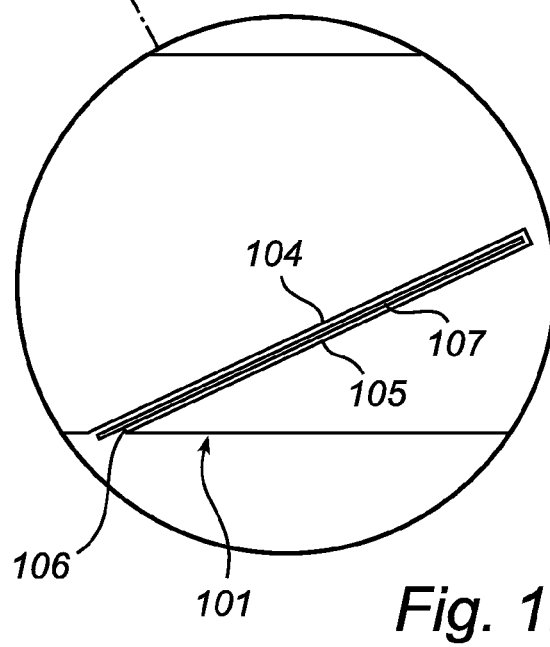

FLAT AND THIN LED-BASED LUMINARY

FIELD OF THE INVENTION

The present invention relates to a light emitting device comprising at least one light emitting diode and a light guide plate. The present invention also relates to such a light guide plate it self and a luminary comprising at least one such light emitting device.

BACKGROUND OF THE INVENTION

Especially if applied in, for instance an office or a professional environment, luminaries should fulfill several requirements. Firstly, the light source should have a sufficiently long lifetime. Conventional luminaries are often based on fluorescent tubes, which have a relatively limited lifetime. In a typical office environment, the tubes themselves need to be replaced every 6000 hours. This corresponds to a replacement every 2 years, which adds to the cost of ownership.

Secondly, the light output of the luminary should be robust against dust and other dirt. A luminary that collects dust will become less efficient, since the dirt blocks light. Since cleaning the luminary is an expensive matter, the design should be robust against dust and dirt.

Thirdly, the luminary should satisfy an anti-glare requirement (i.e. the unified glare ratio should be sufficiently small). This anti-glare requirement means that the luminary should not show any bright spots. In particular, there should be no bright spots if the luminary is viewed under an oblique angle.

A luminary of the prior art is disclosed in U.S. Pat. No. 6,241,358, describing a lighting panel consisting of a set of light guide blocks in tandem arrangement, where a separate fluorescent tube provide light for each light guide block. The light from the fluorescent tubes is transmitted into the respective light guide block, is distributed therein and is transmitted through an output surface of the light guide block. However, as mentioned above, fluorescent tubes have a limited lifetime and are expensive to replace. Further, the breakdown of a single fluorescent tube in this prior art luminary has a drastic negative impact on the lighting capacity of the lighting panel and on the homogeneity of the light from the lighting panel. Thus, when one of the tubes breaks down, it will be necessary to replace this broken tube immediately.

Further, the saw tooth shaped backside of the luminary according to the '358 patent can easily trap a lot of dust and dirt, and is rather complicated to clean.

Additionally, fluorescent tubes emit a constant spectrum, which limits the color variability capacity of such a lighting panel.

SUMMARY OF THE INVENTION

It is an object of the present invention to at least partly overcome the problems of the prior art and to provide a light emitting device that has a long lifetime, is resistant to dirt and dust and is capable of emitting light of variable colors.

The present inventors have found that the above objects may be achieved by means of a light emitting device accorded to the appended claims. Thus, in a first aspect, the present invention relates to light emitting device, comprising a light guide plate and at least one light emitting diode.

The light guide plate comprises a back surface, an opposing front surface and an array of mutually spaced apart reflective surface elements arranged between said back surface and said front surface.

The reflective surface elements are non-parallel relative to said front surface and said back surface, such that each has a front side facing said front surface and a back side facing said back surface. The reflective surface elements are further arranged such that the back side of one reflective surface element faces the front side of an adjacent reflective surface element.

The at least one light emitting diode is arranged to emit light into a region between two adjacent ones of said reflective surface elements.

The light from the LED will be received into the light guide plate and will be distributed therein before exiting the light guide plate via the front surface thereof. The light will be guided from the back surface to the front surface of the light guide by passage between and reflections on two adjacent reflective surface elements.

Due to that the front surface of the light guide and the front side of the reflective surface elements forms an angle, the light will eventually be incident on the front surface at an angle below the critical angle for total internal reflection and will be coupled out of the light guide plate.

Since the reflective surface elements are located within the light guide, both the back surface and the front surface of the light guide plate may be made flat. This flat surface may easily be kept clean from dust and dirt. The use of light emitting diodes as primary light sources is advantageous as they have a long lifetime. Hence, service intervals will be extended, leading to a lower cost of ownership.

Further, light emitting diodes are capable of emitting light of saturated colors, allowing the light emitting device to produce light with high color-variability.

In embodiments of the present invention, the reflective surface elements are separated from said front surface.

When the reflective surface elements are separated from, i.e. not connected to, the front surface of the light guide, this leaves an opening, a gap, between the front surface and the reflective surface elements. Hence, light from an LED which does not couple out of the light guide plate at its incidence on the front surface (for example due to that the angle of incidence exceeded the critical angle for total internal reflection), can be reflected into the region between another, adjacent, pair of reflective surface elements.

In embodiments of the present invention, the reflective surface elements are mutually essentially coplanar.

In order to obtain an essentially homogenous light from a light emitting device of the present invention that has an essentially rectangular shape, it is preferred that the reflective surface elements are parallel, or coplanar, such that the light from each on the LEDs are directed in the same manner In embodiments of the present invention at least part of said reflective surface elements may comprise a slot between said front side and said backside thereof.

A slot between the front and the backsides of the reflective surface element allows total internal reflection to take place on these elements. This will increase the light utilization, since reflection can take place without any absorption of light.

In embodiments of the present invention, a mirror may be arranged at one or more of, or between, said front side and said back side of said reflective surface elements For designs of the light guide plate, where a significant portion of the light incident on the front and/or the back side of the reflective surface elements is below the critical angle of incidence, a mirror may be arranged such that also this light is reflected back into the space between two adjacent reflective surface elements.

In embodiments of the present invention, at least one of said light emitting diodes may be arranged in a recess in said back surface located between said two adjacent reflective surface elements.

In order to have an essentially flat back surface of the total light emitting device, the light emitting diodes may be arranged in recesses in the back side of the light guide plate. This gives a mechanically robust design since the LEDs are less exposed for mechanical wear and tear. Further, the LEDs can easily be physically fixated in the light guide, which may obviate the need for a separate PCB circuit board on which the LEDs typically are arranged. Instead, the LEDs may be connected by simple and cheap electrical wiring on the backside of the device.

In embodiments of the present invention, said at least one light emitting diode may be in optical contact with said light guide plate.

When the LEDs are in optical contact with the light guide material, the light utilization efficiency is increased since a larger portion (essentially all) of the light emitted by the LEDs is coupled into the light guide, in comparison to when the LEDs are located at a distance from and/or not in optical contact with the light guide material. However, the light will be received into the light guide plate with an angular spread of up to 90° with respect to the general direction of the received light, and will hence not be guided by total internal reflection in the light guide. The reflective surface elements in the light guide plate will provide the needed collimation in the direction along their extension In embodiments of the present invention, said at least one light emitting diode may be molded into said light guide plate between said two adjacent reflective surface elements.

When the light emitting diodes are molded into the light guide, they are physically fixated by the light guide plate and can be essentially non-exposed to the surroundings, giving a very robust design, which is easily kept clean.

Further, by molding the LEDs into the light guide plate, they become in optical contact to the light guide plate.

In embodiments of the present invention, a reflective surface may be arranged at said back surface.

Light propagating in the light guide plate may be incident on the back surface at an angle below the critical angle for total internal reflection, and may thus be coupled out from the light guide via the back surface. This is generally unwanted, and a reflective surface may be used on the back side of the light guide plate in order to reflect such outcoupled light back into the light guide for eventual out-coupling via the front surface thereof.

In embodiments of the present invention, more than one light emitting diode may emit light into a single region between two adjacent reflective surface elements.

A plurality of LEDs arranged to emit light into a single such region may together form an extended light source. Such an extended light source will not fully be non-functional in the case one or a few of the LEDs in that plurality of LEDs break down, since the neighboring LEDs will still be in operation. Hence, this yields a robust design for a light emitting device.

Further, a plurality of LEDs of different colors, typically independently addressable, may be used in such a single region in order to provide a color variable light emitting device.

In embodiments of the present invention, the reflective surface elements may form an angle of from about 1° to about 20° to said front and back surface. The angle is set such that the desired degree of collimation is achieved.

When this angle is between about 1° and about 20°, preferably between 2° and 10°, the light from each light emitting diode is distributed in the light guide such that it is outcoupled from the front surface of the light guide at locations corresponding to several pairs of adjacent reflecting surface elements, such that the light from such a light emitting device would be very homogenous over the whole light guide plate.

In embodiments of the present invention, at least one collimator may be formed in a region between two adjacent reflective surface elements, which collimator is arranged in the light path between a light emitting diode emitting light into said space, and to collimate light at least in the direction in the plane of said light guide and perpendicular to the first direction, in which the array of reflective surface elements is extending.

The reflective surface elements in the light guide will essentially not provide any collimation of light in the direction perpendicular to said first direction. By arranging collimators in the regions between adjacent reflective surfaces such that the light in the light guide is collimated in the direction in the plane of the light guide and perpendicular to the extension of the array of reflective surface elements, the light exiting the light guide plate will be collimated in this direction. Such collimators are typically funnel-shaped.

In embodiments of the present invention, at least two collimators may be formed side by side in a space between said two adjacent surface elements, wherein said two collimators are separated by an open void.

When the collimators are made in the material of the light guide plate, and the space between adjacent collimators are formed by an open void, total internal reflection is possible in the interface between the light guide material of the collimator and the open void. Hence, loss-less reflection can take place in these interfaces, increasing the light utilization efficiency of the device.

In embodiments of the present invention a redirection foil may be arranged at said front surface of said light guide, said redirection foil having a prism-faced surface facing said front surface.

In a second aspect, the present invention also relates to a light guide plate as describes above, as such.

BRIEF DESCRIPTION OF THE DRAWINGS

This and other aspects of the present invention will now be described in more detail, with reference to the appended drawings showing a currently preferred embodiment of the invention.

FIG. 1a illustrates one embodiment of a light emitting device of the present invention.

FIG. 1b illustrates a detail of FIG. 1a.

FIG. 1c illustrates in perspective view, the embodiment of FIG. 1a.

DETAILED DESCRIPTION

The present invention relates in one aspect to a light emitting device comprising at least a light guide plate and at least one light emitting diode arranged to emit light into the light guide plate. In another aspect, the present invention relates to such a light guide plate it self. While the below embodiments describe a light emitting device, all details regarding the light guide plate in the described light emitting device also applies to the light guide plate aspect of the invention.

Figure 1C:
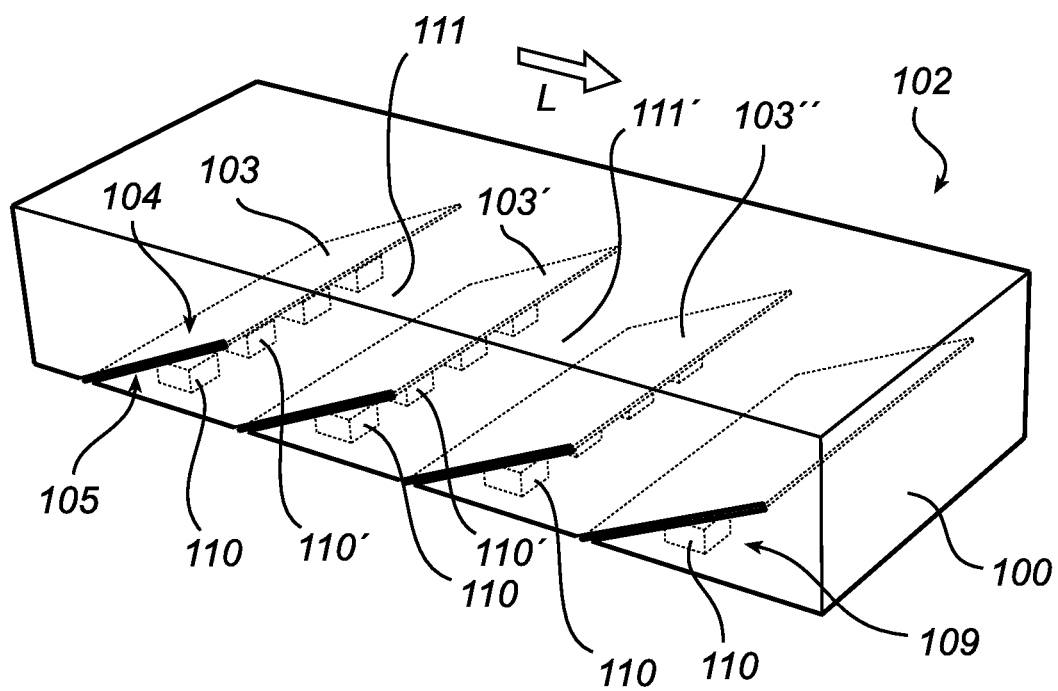

An exemplary embodiment of a light emitting device of the present invention is illustrated in FIG. 1a-c and comprises a light guide plate 100 and a plurality of light emitting diodes 110.

The light guide plate 100 is at least partly transmissive, e.g. translucent or even transparent, and e.g. made of a transparent material, such as optically clear glass, ceramics or plastic material. PMMA (polymetylmethacrylate) and polycarbonate are examples of suitable plastic materials.

The light guide plate 100 is an essentially flat plate having a back surface 101 facing the interior of the light emitting device and a front surface 102, which faces the viewer of the device.

In the light guide plate 100, a plurality of mutually spaced apart reflective surface elements 103 are arranged. The array extends in a direction L in the plane of the light guide plate 100.

Typically, the reflective surface elements 103 represent flat and relatively thin (i.e. thin, in comparison to the thickness of the light guide plate) surfaces.

As seen in FIG. 1c, The reflective surface elements 103 are extended in the direction in the plane of the light guide plate 100 perpendicular to the direction L of the array. Further, the reflective surface elements 103 are connected to the back surface 101, but in this embodiment separated from the front surface 102. Hence, in the reflective surface elements extend from the back surface but not fully to the front surface of the light guide plate. Hence, in the direction of the thickness of the light guide plate 100 (i.e. from the back surface to the front surface), the light guide plate is divided into two portions: a lower portion towards the back surface 101, where the reflective surface elements 103 are located, and an upper portion, towards the front surface 102, where no such reflective surface elements 103 are located.

The reflective surface elements 103 are further non-parallel relative to the front and back surfaces of the plate, such that the elements have a front side 104 facing the front surface 102 of the light guide plate 100, and a back side 105 facing the back surface 101 of the light guide plate 100, and the elements are arranged such that the back side 105 of one element 103 faces the front side 104 of an adjacent element 103'.

The array of reflective surface elements 103 may be a linear array, typically in a linear (e.g. rectangular) light guide plate. In such a linear array, the reflective surface elements 103 are typically mutually essentially coplanar. However, the present invention is not limited to this, and the array may be a circular array, such as for use in a circular light guide plate (in which case the direction L of the array follows the perimeter of the circular light guide). Alternatively, the angle between the reflective surface element 103 and the front and back surfaces of the light guide may vary between different surface elements 103.

The light emitting diodes 110 are arranged to emit light into regions 111 formed between two adjacent reflective surface elements 103, 103', such that the region 111 is located between the back surface 105 of one of the elements 103 and the front surface 104 on the other one of the two elements 103'.

The light received into such a region 111 is propagated towards the front surface 102 of the light guide by reflection on at least one of the reflective surface elements 103, 103' and/or optionally by reflection on the portion of the back surface 101 that is located in said region, or by passing directly to the front surface without reflection.

The region 111 forms a first wedge shaped portion between the reflective surface element 103 and the back surface 101 of the light guide plate 100. This first wedge portion collimates the light in the direction of the height of the light guide plate.

This wedge portion between the reflective surface element 103 and the back surface 101 of the light guide plate is used to collimate any light along the direction L from angles smaller than the critical angle for TIR (total internal reflection) (with respect to the front surface 102) to angles that are larger than the critical angle for TIR (this may occur when the LED is in optical contact with the guide, or when the LED light is not aimed along direction L). Thus, the light is captured into the light guide by this first wedge portion.

The remaining part of region 111 forms an opposite, second wedge shape between the adjacent reflective surface element 103' and the front surface 102. Instead of collimating, this second wedge de-collimates the light and causes the light to leak out of the light guide at surface 102.

Light that is incident on the front surface 102 of the light guide plate 100 at an angle below the critical angle of total internal reflection (TIR) is coupled out of the light guide plate. However, a portion of the light emanating from an LED will be incident on the front surface at angles above the critical angle for TIR, and will thus be reflected towards the back surface of the light guide plate.

Since, in the presently described embodiment, there is a gap between the front surface 102 and the reflective surface elements 103, (i.e. the above mentioned top portion), light from one LED, originally passing in a certain region 111 between a pair of adjacent reflective surface elements 103, 103', may be reflected on the front surface into another region 111', formed between another pair of reflective surface elements 103', 103".

The light that is reflected on the front surface 102 back into the light guide plate will eventually be reflected on the front side 104 of a reflective surface element once more towards the front surface 102. Since the front side 104 of the reflective surface elements 103 forms an angle towards the front surface 102, the subsequent angle of incidence on the front surface 102 will differ from the previous angle of incidence, and the light will propagate in the light guide until it eventually is coupled out of the light guide.

The opening between the front surface and the reflective surface elements allows the light from one LED to be distributed over a large portion of the light guide.

The reflective surface element may comprise a reflecting mirror 107 to effect the reflection, or may, as is illustrated in FIG. 1b, being detail from FIG. 1a, optionally comprise a slot between the front side 104 and the back side 105 of the element 103.

Such a slot 106 should typically be substantially wider (i.e. the distance from the front side to the back side of the reflective surface element) than the wavelength of the light to be propagated in the waveguide. Further, such a slot 106 is typically empty (air) or is filled with a material having a refractive index substantially lower than the refractive index of the light guide plate material. Thus, total internal reflection is allowed on the sides 104, 105 of the reflective surface element 103, yielding essentially loss-less reflection.

A reflecting mirror 107 may be arranged within the slot 106, such as between, or on one of, the front side or back side of the surface element such as to reflect also light incident on the reflective surface element at an angle of incidence below the critical angle of total internal reflection.

Each light emitting diode (LED) 110 are arranged to emit light into a region 111 between two adjacent reflective surfaces 103, 103'. The LEDs 110 may be arranged on or emitting onto the back surface 101 of the light guide plate 100. Typically, the LEDs 110 are accommodated in recesses 109 arranged in the back surface 101 or are molded into the back surface 101 of the light guide plate.

By molding the LED 110 into the light guide 100, the LED is in optical contact with the light guide and the light is efficiently coupled into the light guide.

As illustrated in FIG. 1c, a plurality (two or more) of LEDs 110, 110' may be arranged to emit light into the same single region 111 between two adjacent reflective surface elements 103, 103'. These two or more LEDs 110, 110' are arranged side by side to form a row extending along the extension in the plane of the light guide and perpendicular to the extension L of the array of reflective surface elements 103, 103'. The row of LEDs 110, 110' may act as an extended linear light source.

A row of LEDs 110, 110' may comprise LEDs emitting light of different color. For example, such a row may comprise one or more sets, each set comprising for instance a red, green and blue LED, for forming a color variable light emitting device.

All types of LEDs may be used in a light emitting device of the present invention, including, but not limited to side-emitting and top-emitting LEDs, inorganic, organic and polymeric based LEDs, and LEDs emitting light in the visible, UV and IR wavelength range of light.

The electrical and thermal connections to the LEDs may be either via the bottom side 101 or via the reflectors 103. The LEDs may also be mounted on the reflective surface elements 103, and then together molded in the light guide plate 100.

Some light may non-intentionally be coupled out of the light guide plate via the back surface 101 thereof. A reflective surface 108 may be arranged on the back side of the back surface 101 in order to reflect such light back into the light guide plate for increased light utilization efficiency.

This surface 108 may contain holes for electrical wiring or thermal contact to the LEDs.

The distance between two adjacent reflective surface elements 103, 103', counted along the extension L of the array of elements (i.e. the pitch of the array) is typically in the order of one or a few centimeters, such as from about 0.5 to 30 cm, typically from about 1 to about 10 cm.

For currently used low-power LEDs, such a pitch of about 1-2 cm, and for currently used high-power LEDs, such a pitch of about 3-6 cm has proven useful. However, with increasing LED efficiency and lumens/package, this pitch may increase in the future.

Along the extension L of the array, the pitch may be constant, or may alternatively vary.

The thickness of the light guide plate (i.e. the distance from the back surface to the front surface thereof) is typically in the order of a few millimeters, such as from about 1 to about 20 mm, typically from about 2 to about 10 mm. The thickness however depends on the height of the LEDs and pitch of the reflective surface elements. LEDs are getting smaller, which would allow for thinner light guides. On the other hand, the amount of light per package is increasing, and therefore the pitch could increase. Hence, the thickness could be both smaller and higher than the above mentioned.

Typically, the height of the reflective surface elements (counted along the thickness of the plate) is from about 10 to 100% (i.e. from the back to the front surface) of the thickness of the plate, typically from about 30 to about 70%.

When the reflective surface elements 103 extend fully (100%) from the back surface 101 to the front surface 102, there will be no mixing of light from LEDs arranged in adjacent regions 111, 111', but only mixing of light from LEDs arranged in the same space.

The angle between the front surface 102 of the light guide 100 and the front side 104 of the reflective surface elements 103 is typically in the order of a few degrees, such as from about 2 to about 20°, typically in the range of from about 4 to about 10°.

In general, a smaller angle gives a better collimation. However, given the LED height (for example when the LED is molded into the back surface of the light guide plate) and the pitch, the LEDs will no longer fit between the reflective surface element and the back surface of the light guide plate when the angle is too small. In one exemplary embodiment showing good results, the pitch of the array of reflective surface elements is 1.85 cm, the thickness of the light guide plate is 3 mm, the reflective surface elements extend to 2 mm of the height (66.7%), and the angle of the reflective surface elements is 6° to the front surface of the light guide plate.

Typically, the extension of the reflective surface elements 103, counted along the direction L of the array, is about the same as the distance between adjacent reflective surface elements, counted along the same direction (i.e. the pitch). However, this extension may be somewhat larger than the pitch (resulting in overlapping reflective surface elements), or may alternatively be somewhat smaller than the pitch.

The above-proposed design of the light guide plate does not yield any essential collimation in the direction in the plane of the light guide and perpendicular to the extension L of the array of reflective surface elements 103.

Figure 2:
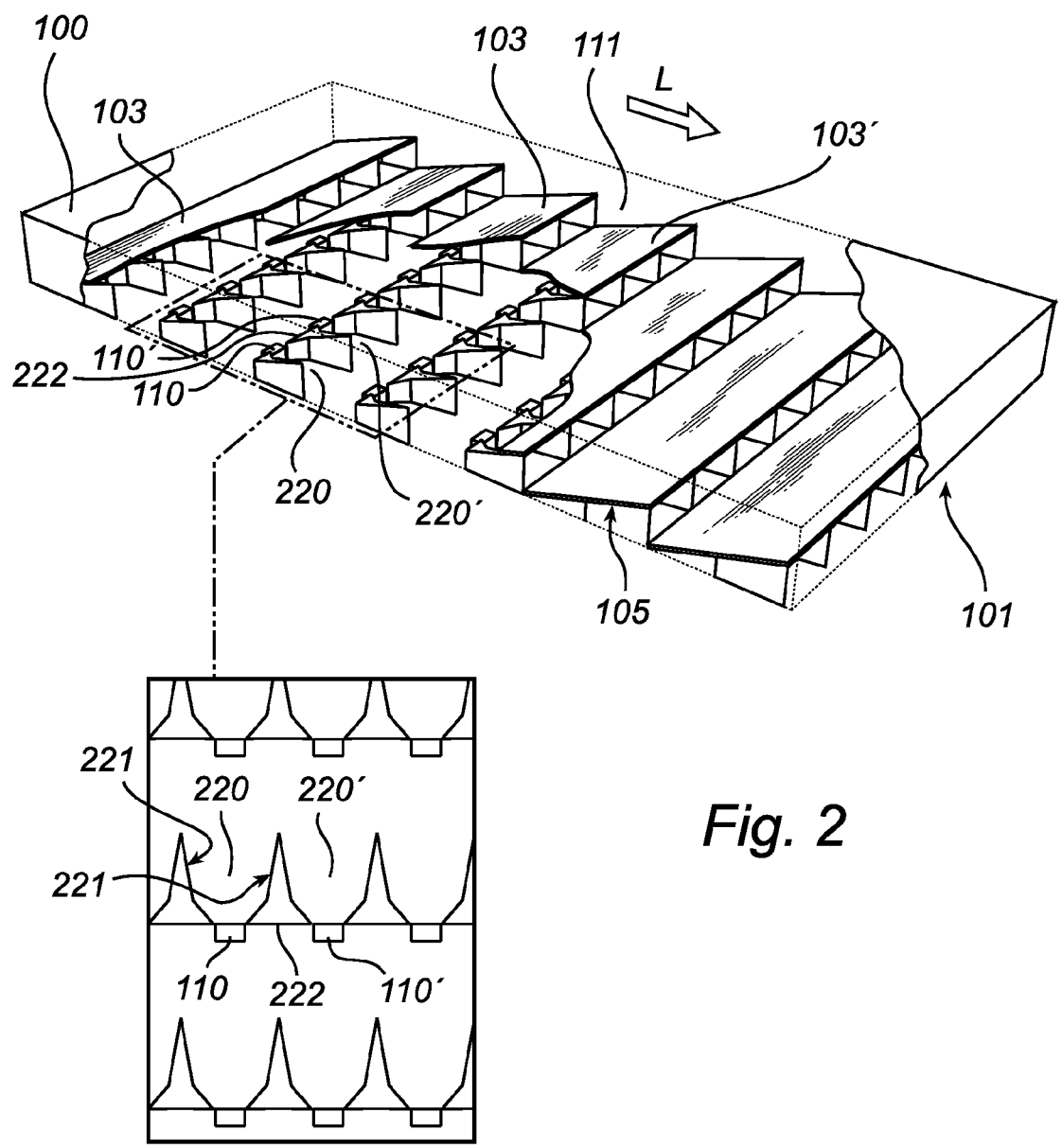
FIG. 2 illustrates another embodiment of a light emitting device of the present invention.

Hence, in a second exemplary embodiment of a light emitting device of the present invention, as illustrated in FIG. 2, collimators 220, to collimate the light in this direction, are incorporated in the light guide plate design.

The collimators 220 are arranged in front of the LEDs 110 (i.e. in the beam path between the LEDs and the front surface of the light guide plate, and in the space between the two adjacent reflective surface elements (103, 103').

The collimators are limited by the back side 105 of a reflective surface element 103, the back surface 101 of the light guide plate and by side walls 221 extending from the back surface 101 of the light guide plate to the back side 105 of the reflective surface element The collimators 220 are funnel shaped such that the distance between the sidewalls 221 increases with the distance from the LED. The sidewalls 221 are typically reflective.

When light in a collimator 220 is reflected on the sidewalls 221 thereof, the angular spread of the light, in the direction in the plane of the light guide and perpendicular to the extension L of the array of reflective surface elements 103, is decreased, i.e. the light is collimated in this direction.

Typically, a plurality (more than one) of collimators 220, 220' are located adjacently side by side in the same region 111 between two adjacent reflective surface elements 103, 103' to collimate the light from separate LEDs 110, 110' or separate groups of LEDs.

One way to form the sidewalls 221 is to arrange a void 222 separating the adjacent collimators 220, 220'. The void 222 should be empty (air, vacuum, other gas) or filled with a material having refractive index substantially lower than that of the light guide plate material. The sidewalls 221 are then formed as the interface between the light guide material and the void 220, and thus, total internal reflection is possible on the sidewalls 221, leading to essentially loss-less reflection on these surfaces.

In addition to providing very efficient reflection, the collimators 220, 220' may be easily formed in an injection-molding step.

Alternatively, mirror surfaces may be molded into the light guide plate material to form the sidewalls 221.

The introduction of such collimators 220 into the light guide plate design yields a light emitting device which provides light that is collimated in all directions in the plane of the light guide plate.

As will be apparent to those skilled in the art, the light from a light emitting device as illustrated in FIGS. 1 and 2 will typically exit the light guide plate via the front surface 102 thereof into the surroundings at an noticeable angle with respect to the normal of the front surface 102.

For instance, such a light emitting device may be well suited for illuminating the ceiling when hung on a wall, or for illuminating a wall when arranged in the ceiling, but also for other purposes where light emission out of the normal of the front surface is desired.

However, in certain applications, it is desired to redirect the light exiting the light guide plate, for example to obtain light having a main direction at or close to the normal of the front surface of the light guide plate.

Thus, in embodiments of the present invention, and as is illustrated in FIG. 1a, a redirection sheet 300 may be arranged at the front surface 102 to receive light that exits the light guide plate 100 via the front surface 102, in order to redirect the main direction of this light.

An example of such a redirection sheet 300 comprises a sheet of a translucent material (i.e. plastic, ceramic or glass), which has a prismatic surface 301 facing the front surface 102 of the light guide plate 100.

In an embodiment, the prismatic surface 301 comprises an array of mutually parallel protrusions 302. For high efficiency, the protrusions 302 are advantageously essentially parallel to the reflective surface elements 103 the light guide plate 100.

Typically, the protrusions 302 have a triangularly shaped cross-section with an apex angle in the range of from 20 to 70°, preferably about 40°. The protrusions 302 typically formed at a pitch (distance between two adjacent protrusions) that are markedly lower than the pitch of the reflective surface elements 103. Typically, the pitch of the protrusions 302 is in the range of about 50 to 500 μm.

The protrusions 302 may further be asymmetric to the normal of the front surface 102 in order to direct the light from the light guide plate into a mean direction along the normal of the front surface. For an asymmetric protrusion 302, the centerline of the protrusion is not parallel to the normal of the front surface 102.

Light emitting devices and light guide plates of the present invention may be used in any application where they are suitable. Non-limiting exemplary areas of use include the use in or as luminaries for general lighting applications, such as in homes, offices, vehicles etc, and for backlighting of display devices. For example, such a luminary may comprise one or more light emitting devices of the invention.

The invention claimed is:

1. A light emitting device, comprising a light guide plate and at least one light emitting diode, which plate comprises a back surface, an opposing front surface and an array of a plurality of mutually spaced apart reflective surface elements arranged between said back surface and said front surface, wherein said reflective surface elements are non-parallel relative to said back surface and front surface, and have a front side facing said front surface and a back side facing said back surface, the back surface of a reflective surface element faces the front surface of an adjacent reflective surface element, and said at least one light emitting diode is arranged to emit light into a region between two adjacent ones of said reflective surface elements;

wherein at least one of said reflective surface elements defines a slot between said front side and said back side thereof.

2. A light emitting device according to claim 1, wherein said reflective surface elements are separated from said front surface.

3. A light emitting device according to claim 1, wherein said reflective surface elements are mutually coplanar.

4. A light emitting device according to claim 1, wherein a mirror is arranged at one or more of, or between, said front side and said back side of said reflective surface elements.

5. A light emitting device according to claim 1, wherein said at least one light emitting diode is arranged in a recess in said back surface located between said two adjacent reflective surface elements.

6. A light emitting device according to claim 1, wherein said at least one light emitting diode is in optical contact with said light guide plate.

7. A light emitting device according to claim 1, wherein said at least one light emitting diode is molded into said light guide plate between said two adjacent reflective surface elements.

8. A light emitting device according to claim 1, wherein a reflective surface is arranged at said back surface.

9. A light emitting device according to claim 1, wherein more than one light emitting diode emits light into a single space between two adjacent reflective surface elements.

10. A light emitting device according to claim 1, wherein the front side of said reflective surface elements forms an angle in the range of from 1° to 20° to said front surface.

11. A light emitting device according to claim 1, wherein a redirection foil is arranged at said front surface of said light guide, said redirection foil having a prism-faced surface facing said front surface.

12. A light emitting device, comprising a light guide plate and at least one light emitting diode, which plate comprises a back surface, an opposing front surface and an array of a plurality of mutually spaced apart reflective surface elements arranged between said back surface and said front surface, wherein said reflective surface elements are non-parallel relative to said back surface and front surface, and have a front side facing said front surface and a back side facing said back surface, the back surface of a reflective surface element faces the front surface of an adjacent reflective surface element, and said at least one light emitting diode is arranged to emit light into a region between two adjacent ones of said reflective surface elements;

wherein at least one collimator is formed in a space between two adjacent reflective surface elements, which collimator is arranged in the light path between a light emitting diode emitting light into said space, and to collimate light at least in the direction in the plane of said light guide said array of reflective surface elements extending perpendicular to said first direction.

13. A light emitting device according to claim 12, wherein said collimator is funnel-shaped.

14. A light emitting device according to claim 12, wherein at least two collimators are formed side by side in said region between said two adjacent surface elements, and wherein said two collimators are separated by an open void.

* * * * *